US006215835B1

(12) United States Patent
Kyles

(10) Patent No.: US 6,215,835 B1
(45) Date of Patent: Apr. 10, 2001

(54) DUAL-LOOP CLOCK AND DATA RECOVERY FOR SERIAL DATA COMMUNICATION

(75) Inventor: Ian Kyles, West Linn, OR (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 08/917,646

(22) Filed: Aug. 22, 1997

(51) Int. Cl.⁷ ...................................................... H03D 3/24
(52) U.S. Cl. ............................................. 375/376; 375/326
(58) Field of Search ................................ 375/376, 326, 375/327; 331/1 A

(56) References Cited

U.S. PATENT DOCUMENTS

| | | | | |
|---|---|---|---|---|
| 4,577,241 | * | 3/1986 | Wilkinson | 360/51 |
| 5,353,313 | * | 10/1994 | Honea | 375/118 |
| 5,432,827 | * | 7/1995 | Mader | 375/376 |
| 5,495,233 | * | 2/1996 | Kawashima et al. | 340/825.21 |
| 5,559,833 | * | 9/1996 | Hayet | 375/259 |
| 5,761,255 | * | 6/1998 | Shi | 375/360 |

OTHER PUBLICATIONS

Vitesse Semiconductor Corporation, *VSC7125 Data Sheet (1.0625 Gbits/sec Fibre Channel Transceiver*, not dated, pp. 1–16.

* cited by examiner

*Primary Examiner*—Stephen Chin
*Assistant Examiner*—Mohammad Ghayour

(57) ABSTRACT

A clock and data recovery circuit for use in a serial data communications channel includes two phase-locked loops, the two PLLs being coupled together through the use of a matched pair of voltage controlled oscillators. Each of the matched pair of oscillators includes both coarse and fine adjustment inputs. The first loop generates a first frequency based upon a reference clock input and provides a coarse tuning signal, based on the first frequency, to the second loop circuit. The second VCO drives the second loop circuit at the same frequency as the first circuit, while the second circuit is also coupled to the incoming data stream so as to provide the fine adjustment input to the second VCO. In this way, the second VCO, i.e., the second loop, is synchronized to the data, yet it remains synchronized to the reference frequency even during relatively long periods of time during which transitions in the data stream are infrequent.

18 Claims, 4 Drawing Sheets

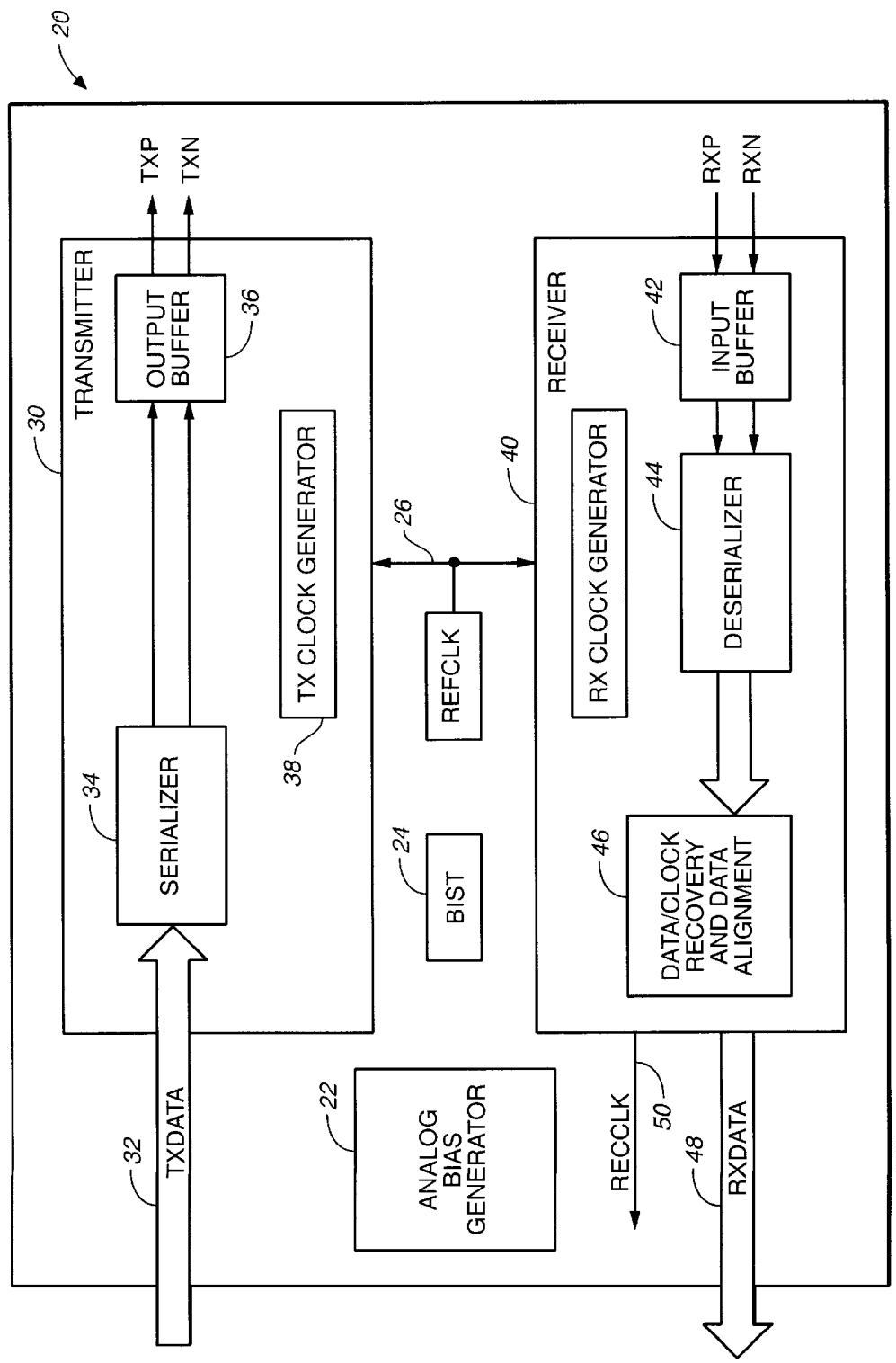
FIG._1 (PRIOR ART)

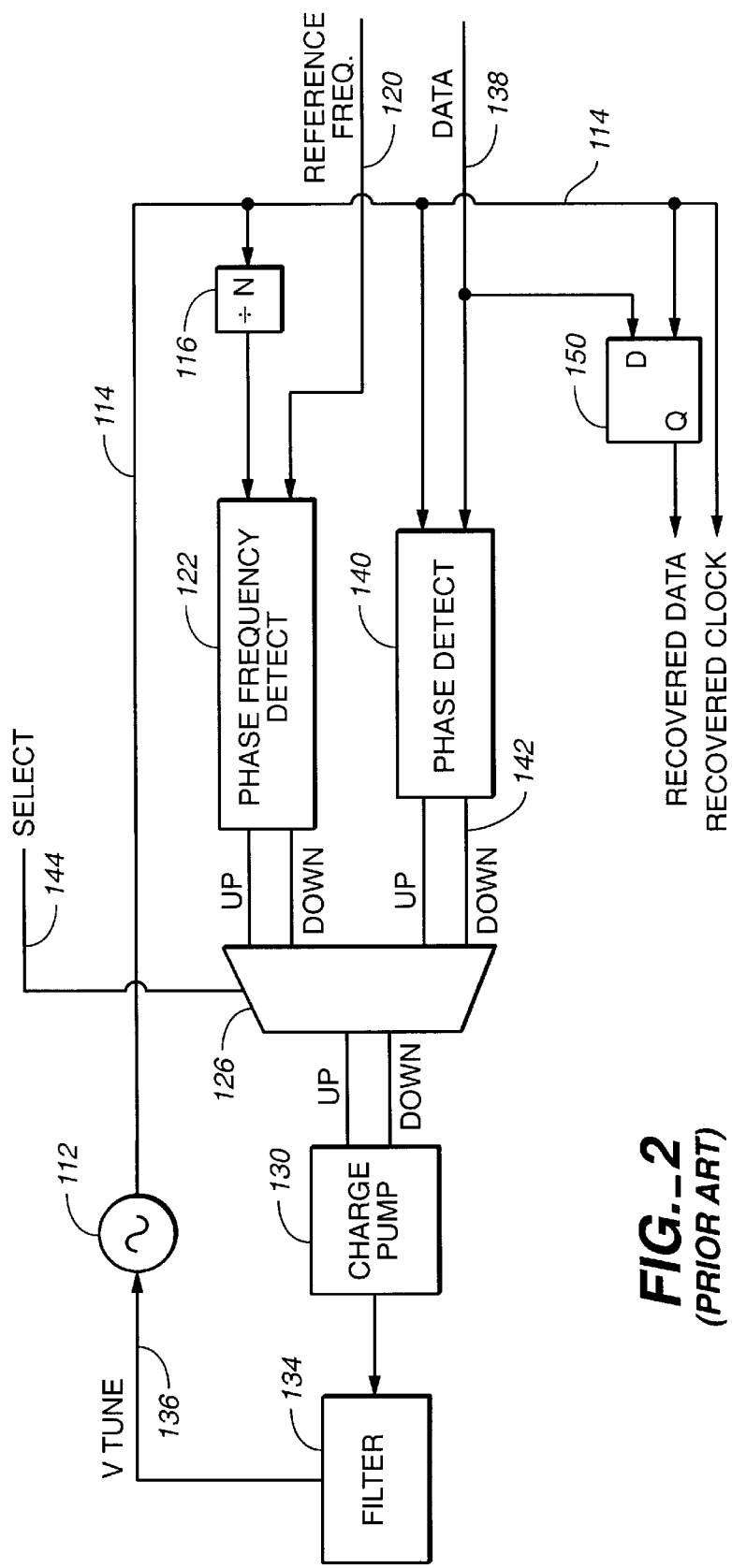
FIG._2
(PRIOR ART)

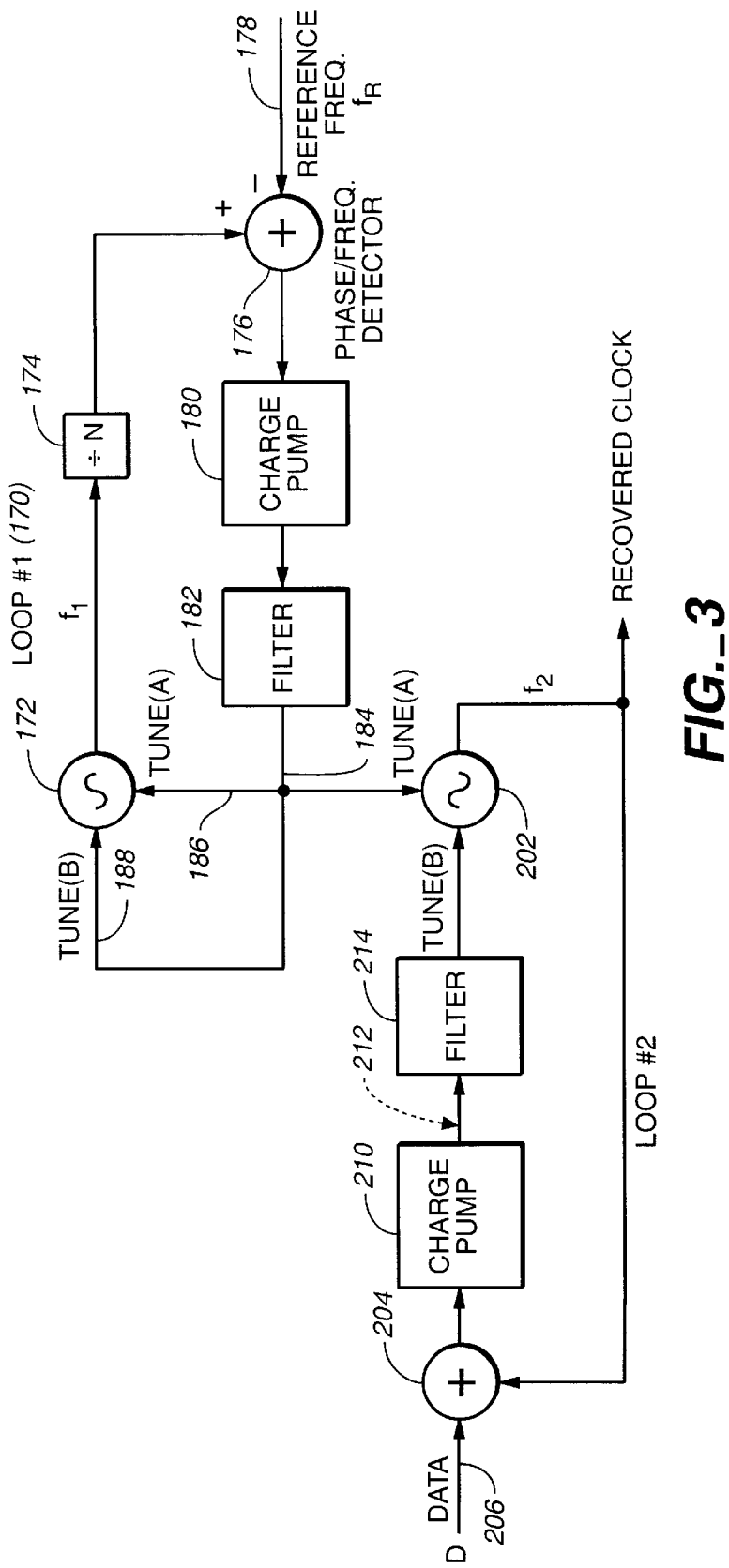
FIG._3

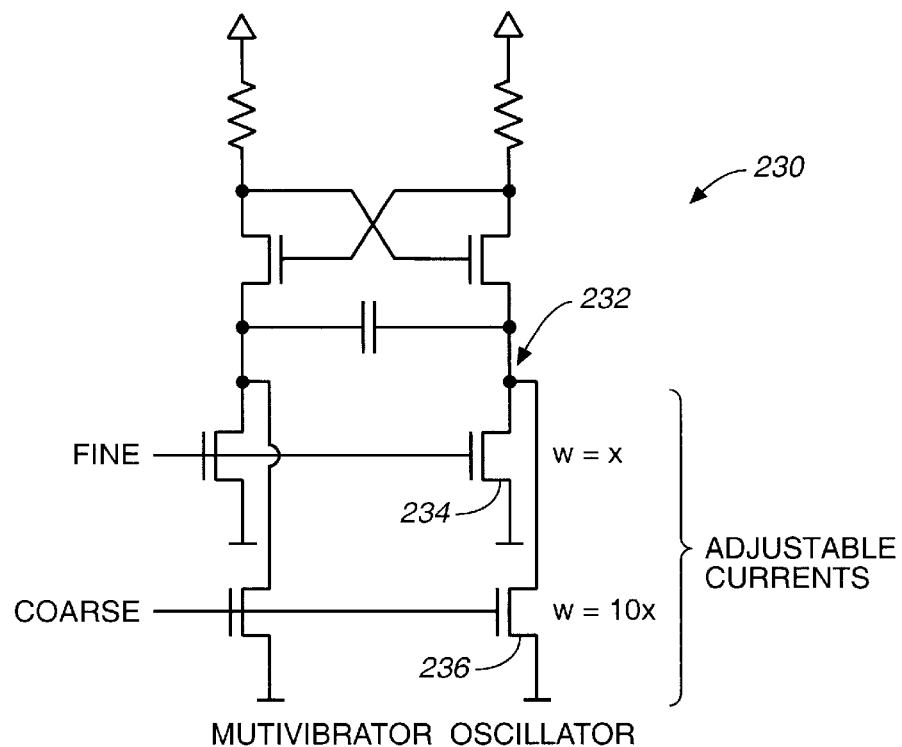
FIG._4A
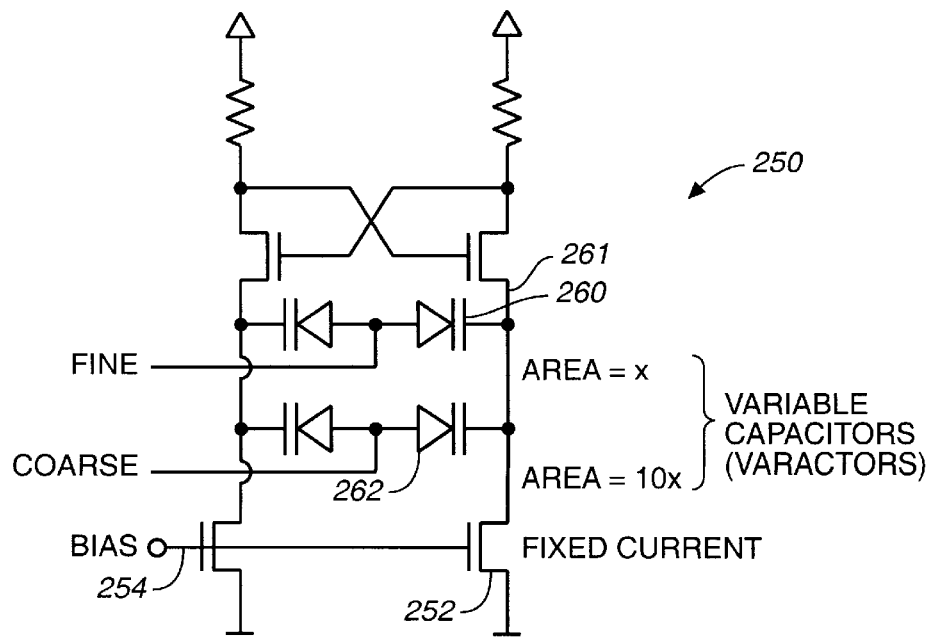
FIG._4B

DUAL-LOOP CLOCK AND DATA RECOVERY FOR SERIAL DATA COMMUNICATION

FIELD OF THE INVENTION

This invention is in the field of serial data communications and, more specifically, relates to methods and apparatus for clock and data recovery in a serial receiver circuit.

BACKGROUND OF THE INVENTION

In serial data communications, a clock signal is recovered from an incoming stream of serial data. The recovered clock signal must be synchronized to the incoming data. The recovered clock signal can then be used for clocking or "retiming" the incoming data. Clock and data recovery circuits known in prior art use a phase-lock loop circuit to generate the recovered clock signal. Prior art circuits, however, tend to drift when there are few transitions in the incoming data stream. Transitions, or "edges" are essential to adjusting the clock phase to synchronize to the incoming data. For this reason, most systems require at least a minimum density of transitions in the data. One way to ensure sufficient transitions is to encode the serial data, for example using the 8b/10b encoding as specified in the Fibre Channel protocol. Such encoding is expensive in that it requires extra encoding circuitry at the transmission end, and conversely decoding circuitry at the receiver. More importantly, such encoding exacts a substantial penalty in bandwidth. What is needed is improved methods and apparatus for serial data and clock recovery in high-speed serial data communication systems.

Accordingly, one object of the present invention is to improve stability and reliability of data and clock recovery in high-speed serial data communication systems.

Another object of the invention is to reduce dependence upon transitions in the serial data stream for clock recovery.

A further object is to increase effective bandwidth of a serial channel by relaxing special data encoding requirements.

A still further object is to provide an improved clock and data recovery circuit for use in a semiconductor integrated circuit serial communications channel.

The foregoing and other objects, features and advantages of the invention will become more readily apparent from the following detailed description of a preferred embodiment which proceeds with reference to the appended drawings.

BRIEF DESCRIPTION OF THE DRAWINGS

FIG. 1 is a simplified block diagram of a serial communications transceiver circuit known in the prior art.

FIG. 2 is a simplified block diagram of a prior art single-loop serial clock and data recovery circuit used in a typical serial receiver circuit.

FIG. 3 is a simplified block diagram of a dual loop clock and data recovery circuit according to the present invention.

FIGS. 4A and 4B illustrate two examples of coarse-fine adjustable VCOs.

DETAILED DESCRIPTION OF A PRESENTLY PREFERRED EMBODIMENT

FIG. 1 is a simplified block diagram of a serial communications transceiver known in the prior art. This transceiver is implemented on a semiconductor integrated circuit 20, for example as an ASIC CMOS implementation. This type of transceiver is protocol-independent and can be interfaced to fiber optics, terminator twinax line or a PCB trace. The transceiver circuit 20 includes an analog bias generator 22 and built-in self-test circuitry 24 which are not pertinent here. A reference clock source 26 provides a reference clock signal to both a transmitter circuit 30 and receiver circuit 40. The transmitted circuit 30 receives parallel data TXDATA over a parallel input port 32. The parallel data is serialized in serializer 34 and the resulting serial data is driven by an output buffer 36 onto a serial output line pair TXP, TXN. The serial output data is clocked according to a transmission clock generator 38 which generates the transmission clock responsive to the reference clock 26.

The receiver circuit 40 receives serial circuit data 40 receives a differential stream of serial input data RXP, RXN, through an input buffer 42. The serial data is deserialized in deserializer 44 and a clock and data recovery circuitry 46 recovers the data, and the receive data clock signal, from the incoming data stream. Circuitry 46 also aligns the data into the appropriate word size, and outputs the received parallel data at port 48. The recovered clock also is output at 50 for clocking other logic in synchrony with the incoming serial data stream. One implementation of a transceiver of this type is the GigaBlaze(tm) SerialLink® transceiver product commercially available from LSI Logic Corporation, assignee of the present invention. The GigaBlaze transceiver provides a point-to-point, full duplex differential, serial communications link for transferring data at up to 1.25 Gbits/sec. Other serial transceivers are commercially available from Vitesse Semiconductor Company of Camarillo, Calif.; part no. VSC7125 Fiber Channel, and VSC7135 Gbit Ethernet Transceiver.

FIG. 2 illustrates a prior art serial receiver clock and data recovery circuit. A phase lock loop circuit indicated by dashed line 110 comprises a voltage controlled oscillator (VCO) 112 to provide a clock signal at line 114. The clock signal from the VCO is input to a divide by N circuit 116 to divide it down to a predetermined reference frequency. A reference frequency source (i.e. a reference clock signal) is input at line 120 and compared to the divide-by-N clock signal in a phase-frequency detector circuit 122. If the divided clock frequency is lower than the reference frequency, the detector 122 asserts the "up" signal through multiplexer 126 to cause a charge pump 130 to increase a tune voltage for controlling the VCO 112. The charge pump output at line 132, typically an analog voltage, is input to a filter 134 and the filtered tuning voltage "VTune" is input to the VCO at line 136 to increase the clock frequency in an effort to match it to N times the reference frequency.

Conversely, if and when the detector 122 determines that the clock frequency f/N is greater than the reference frequency at 120, it asserts a down "DN" signal through MUX 126 to the charge pump 130 in order to lower the tune voltage and thereby lower the frequency output by the oscillator 112. In this manner, the VCO 112, divide-by-N 116, detector 122, charge pump 130 and filter 134 form a closed loop—often called a phase lock loop or PLL—for dynamically adjusting the VCO frequency in order to hold it to N times the reference frequency. However, merely matching the frequency of a serial data stream is insufficient to accurately recover the data. The precise phase of the data stream must be taken into account as well. To illustrate, imagine the data stream consists of a series of alternating 1's and 0's much like a sine wave. If the recovered clock is out of phase, every recovered data bit will be wrong!

To properly recover the serial clock and data, the incoming data stream at line 138 is compared to the clock frequency 114 in a phase detector circuit 140. Phase detector circuits of various types are known in the prior art and therefore are not described here in detail. If a given transition or "edge" of the clock signal 114 is ahead of or "leads" a corresponding edge of the data stream at 138, the detector circuit 140 asserts the down "DN" output 142. This control signal is conveyed through muliplexer 126 to the charge pump 130 to affect a slight downward adjustment of the tune voltage at line 132 which, in turn, slightly lowers the frequency of the clock signal output by the VCO 112 to move into closer synchronization with the serial data stream. Conversely, when the clock signal 114 lags behind the data stream at 138, detector circuit 140 asserts the "UP" signal through MUX 126 to cause the charge pump to slightly increase the tune voltage applied to the VCO, and thereby slightly increase the frequency of its output. Thus, the first detector 122 can be considered a coarse adjustment of the VCO loop in order to drive the VCO to the right frequency, while the phase detector 140 adjusts the phase of the clock signal 114 so as to synchronize it to the incoming data stream. Since these two signals are synchronized, the clock signal 114 provides the recovered clock signal and the recovered clock signal is used to clock flip flop 150 to recover data from the incoming data stream.

Multiplexer 126 is arranged for controllably selecting as control inputs to the charge pump 130, one at a time of the frequency detector 122 and, alternatively, the phase detector 140, in response to the select control signal 144. Generally, while a serial data stream is being received, the clock signal 114 is at the correct frequency, i.e., the frequency of the serial data stream, and the multiplexer 126 is set to couple the output of phase detector 140 to the charge pump, in order to keep the recovered clock signal synchronized to the data stream. If and when synchronization is lost, the select input 144 to the multiplexer 126 switches so as to apply the detector 122 output to the charge pump to force the VCO to N times the reference frequency. Having done so, the multiplexer can then switch back to the phase detector 140 to again synchronize with the data. In other words, when synchronization is lost, the circuit falls back to the reference frequency, temporarily, in order to resynchronize to the data.

During normal operation, the phase detector 140 compares transitions in the recovered clock signal 114 to transitions in the data signal 138 as described above. This recovery technique works adequately as long as there are sufficient transitions in the data. In other words, if the data signal goes for a long time, say 50 or 100 bit units, without any transition, the tuning signal Vtune drifts and consequently the recovered clock signal frequency and phase drifts as well. Various protocols are known for encoding serial data, prior to transmission, so as to ensure that transitions occur within some predetermined maximum number of bit units. However, these encoding schemes increase overhead, and reduce effective bandwidth, and, obviously, they impose constraints on the nature of the data. The present invention, described next, allows relatively long data streams without any transitions without significant clock drift, and without loss of bandwidth to embed the serial clock.

FIG. 3 is a simplified schematic diagram illustrating a dual-loop clock and data recovery circuit according to the present invention. In a first loop 170, a first oscillator provides a clock signal having a frequency f1 to a divide by N circuit 174. The resulting signal, having a frequency f1/N, is input to a detector circuit 176 where it is compared to a reference frequency fR input at line 178. The reference frequency source may be another oscillator, for example a crystal-controlled oscillator, or some other external source.

The output voltage from detector 176 is input to a charge pump 180 and the charge pump voltage is filtered in a filter 182 so as to form a first or coarse tuning control voltage "tune A" at node 184. Oscillator 172 has two control voltage inputs, a coarse tuning input 186 and a fine tuning input at 188. In this circuit, both of the coarse and fine tuning inputs are connected to receive the control voltage tune A at node 184. The divide by N circuit may be arranged to divide the frequency f1 by some value within a range approximately in the order of 10–100, so that the reference frequency can be substantially lower than the oscillator frequency f1. The time constant of filter 182, gain of the oscillator 172, and other particulars of the loop 170 will depend upon the specific application, and clock frequencies, etc. Specific values can be readily determined by one of ordinary skill in the art for a specific implementation in view of this disclosure.

The second loop circuit 200 comprises a second oscillator 202 which provides a second clock signal f2 as the recovered clock signal. In the second loop circuit 200, the recovered clock signal f2 is input to a second detector circuit 204 in which the phase of the recovered clock signal is compared to the phase of the incoming data stream at 206. The output of detector 204 is input to a second charge pump 210 in order to form a control or error voltage at node 212. The error voltage is applied to a filter 214 to form a tuning voltage "tuneB" at node 216. The second oscillator 202 is identically matched to the first oscillator 172, and likewise includes a coarse adjustment input at node 184 and a fine adjustment input at node 216. By a "coarse input" we mean that the oscillator VCO gain with respect to the voltage at the coarse input is substantially greater than the VCO gain with respect to the voltage applied at the fine input. For example, in practice, the difference in VCO gain as between the fine and coarse input may be on the order of 10X or 100X. The specific gains are not critical to the invention, as long as the VCO gain responsive to the coarse input is much greater than that of the fine input.

FIGS. 4A and 4B illustrate two examples of ways to implement coarse and fine adjustments to voltage control oscillator circuits. In FIG. 4A an oscillator circuit 230 includes fine and coarse adjustment paths for adjusting the current at node 232. The fine adjustment input is connected to the control gate of a first transistor 234 while the coarse input signal is connected to the control gate of a second transistor 236 connected in parallel with transistor 234 to node 232. Devices 234 and 236 are physically scaled so that the channel width of the coarse adjustment device 236 is 10 times the channel width of the fine adjustment device 234. This is just an example, and other scaling factors could be used.

FIG. 4B is another example of implementing coarse and fine adjustments to a VCO. In FIG. 4B, another VCO 250 has a first variable capacitor or varactor 260 coupled in series between the fine adjustment input and a common node 261. The coarse adjustment input is connected to a second variable capacitor 262 which also is connected to the common node 261. Finally, a fixed current source is connected between node 261 and ground, implemented by a field effect transistor 252 controlled by a predetermined bias voltage at node 254. In this circuit, the respective capacitances of the variable capacitors 260, 261 are scaled as desired, by selecting the area of the capacitive devices. For example, device 262 which is coupled to the coarse adjustment input may be 10 times the area of the fine adjustment input device 260. Other implementations of coarse and fine adjustment inputs to oscillators will be apparent to those skilled in the art.

Operation

The circuit of FIG. 3 operates generally as follows. The first loop 170 has both the coarse and fine oscillator inputs connected to the same control voltages at node 184. The loop as described will drive the frequency f1 to N times the reference frequency and dynamically adjust the frequency to track the reference frequency. It should be noted that operation of loop number 1 is independent of the incoming data stream at 206. Since the first and second oscillators 172 and 202, respectively, are matched, the tuneA or coarse control voltage at node 184, will control the second oscillator 202 so as to provide a second clock at frequency f2 that is approximately equal to N times the reference frequency, as in loop number 1. Additionally, the phase of f2 is compared to that of the incoming data signal in detector 204, to form the fine adjustment control voltage tuneB at 216. This input will "fine tune" the second oscillator 202 so as to bring the phase of the recovered clock signal f2 into synchrony with the data stream. Since the VCO gain with respect to the fine tune input tuneB is much lower than the gain with respect to tuneA, loop #1 will tend to keep f1 locked to $F_R \times N$ and likewise, f2 will remain very close to $F_R \times N$, regardless of variations in the data. In other words, even if data transitions at the input 206 are relatively sparse, so that fine tune voltage at 216 drifts, the second oscillator 202 will remain locked at the correct frequency, i.e., $F_R \times N$. Further, if the time constant of the filter 214 is long enough, the second loop circuit 200 will stay on frequency, i.e., continue to track data correctly, for a longer period than alternative clock and data recovery circuits such as those described above with reference to prior art. Indeed, for the reasons just described, the recovered clock signal will continue to run on frequency, and may drift only slightly, notwithstanding a relatively long interlude between data transitions. This invention thus provides a recovered clock signal that is not fully dependent on data transitions. Rather, data transitions are used only to "fine tune" the phase of the recovered clock signal. The magnitude of frequency drift in this circuit is sharply limited and reliability of the receiver improved.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A method of recovering a data clock signal responsive to a serial data stream, the method comprising the steps of:
   providing a first clock signal to a first input to a first phase-locked loop circuit, the first clock signal having a predetermined frequency substantially equal to an expected frequency of the serial data stream;
   generating a second clock signal responsive to the first clock signal so that the second clock signal has substantially the same frequency as the first clock signal, wherein the step of generating the second clock signal is performed by the first phase-locked loop circuit;
   providing the serial data stream to a second input to the first phase-locked loop circuit;
   without changing the frequency of the first clock signal, fine tuning the second clock signal responsive to the serial data stream so that the second clock signal forms a recovered clock signal in synchrony with the serial data stream.

2. A method according to claim 1 wherein said providing a first clock signal includes providing a second phase-locked loop circuit for generating the first clock signal.

3. A method according to claim 2 wherein the second phase-locked loop circuit for generating the first clock signal includes a first detector responsive to a reference frequency signal applied as an input to the first phase-locked loop circuit.

4. A method according to claim 1 wherein said providing a first clock signal includes providing a first phase-locked loop circuit for generating the first clock signal; and said generating a second clock signal responsive to the first clock signal includes providing a second phase-locked loop circuit for generating the second clock signal and linking the second phase locked loop to the first phase locked loop so that the frequency of the second clock signal tracks the frequency of the first clock signal.

5. A method according to claim 4 wherein said linking step comprises effecting a coarse adjustment of the frequency of the second clock signal responsive to the frequency of the first clock signal.

6. A method according to claim 4 wherein said providing a first clock signal includes providing a predetermined reference frequency clock signal and adjusting the first clock signal to a frequency equal to a predetermined integer multiple of the reference frequency.

7. A method according to claim 6 wherein the reference frequency is approximately on the order of 100 MHz.

8. A serial data clock recovery circuit comprising:
   a first circuit for generating a first clock signal;
   a second circuit for generating a second clock signal, the second circuit comprising a phase-locked loop circuit;
   means for linking the second circuit to the first circuit so that, in operating, the second clock signal has a frequency responsive to the frequency of the first clock signal; and
   means in the second circuit for adjusting a phase of the second clock signal so as to synchronize the second clock signal to a serial data stream applied as an input to the second circuit.

9. A serial data clock recovery circuit according to claim 8 wherein the first and second circuits include first and second matched oscillators, respectively, each of the matched oscillators having both coarse and fine tuning inputs; and the means for coupling the second circuit to the first loop circuit includes means for connecting the coarse tuning inputs to both the first and second matched oscillators so as to receive a single tune signal, whereby in operation the first and second clocks signals will exhibit substantially the same frequency.

10. A serial data clock recovery circuit according to claim 8 wherein the means for adjusting the phase of the second clock signal includes a detector means for comparing a phase of the second clock signal to the phase of the serial data stream and forming a fine tune signal.

11. A serial data clock recovery circuit according to claim 10 wherein the means for adjusting the phase of the second clock signal includes a VCO having a coarse adjustment input and a fine adjustment input, the coarse adjustment input being coupled to the first loop circuit for tracking the first clock signal; and the fine adjustment input being responsive to the fine tune signal, whereby the coarse adjustment input to the VCO provides the means for linking the second loop circuit to the first loop circuit.

12. A serial data clock recovery circuit according to claim 8 wherein the first circuit comprises:
   a first voltage-controlled oscillator for generating the first clock signal; a divider circuit for dividing the first clock signal by an integer number N; a detector for comparing the divided first clock signal to a predetermined reference frequency clock signal; and feedback means for dynamically adjusting the frequency of the first oscillator responsive to the detector so that the first clock signal maintains a frequency equal to N times the reference frequency.

13. A serial data clock recovery circuit according to claim 12 wherein the second circuit comprises:

a second voltage-controlled oscillator for generating the second clock signal; a detector for comparing the second clock signal to the serial data stream; and feedback means for dynamically adjusting the second voltage-controlled oscillator responsive to the detector so that the second clock signal is synchronized to the serial data stream, thereby recovering the serial data clock.

14. A serial data clock recovery circuit according to claim 8 wherein the second circuit comprises:

a second voltage-controlled oscillator for generating the second clock signal; a detector for comparing the second clock signal to the serial data stream; and feedback means for dynamically adjusting the second voltage-controlled oscillator responsive to the detector so that the second clock signal is synchronized to the serial data stream, thereby recovering the serial data clock.

15. A serial data clock recovery circuit according to claim 8 wherein the means for linking the second circuit to the first circuit includes:

a matched pair of oscillators, a first one of the matched pair of oscillators deployed in the first circuit for generating a first clock signal; and the second one of the matched pair of oscillators deployed in the second loop circuit for generating the second clock signal;

each of the matched pair of oscillators having coarse and fine tuning inputs for receiving coarse and fine tuning signals, respectively; and wherein the coarse tune signal input to the first one of the matched pair of oscillators is also input to the coarse tune input to the second oscillator.

16. A serial clock data recovery circuit according to claim 8 wherein the first and second voltage-controlled oscillators each includes first and second transistors coupled to a common node for adjustable current control, each of the oscillators having a fine adjustment input connected to control the first transistor and a coarse adjustment input connected to control the second transistor, the second transistor having a channel width scaled to approximately an integer multiple times the channel width of the first transistor.

17. A serial data clock recovery circuit comprising:

a first phase-lock loop circuit including a first voltage-controlled oscillator for generating a first clock signal having a predetermined frequency; and a second phase-lock loop circuit including a second voltage-controlled oscillator for generating a second clock signal having approximately the same frequency as the first clock signal;

the first and second phase-lock loop circuits including first and second matched oscillators, respectively, each of the matched oscillators having both coarse and fine tuning inputs; and the coarse tuning inputs to both the first and second matched oscillators being connected together to receive a single tune signal, so that the first and second clocks signals have substantially the same frequency in operation.

18. A serial data clock recovery circuit according to claim 17 wherein the second phase-lock loop circuit includes a phase detector coupled to the second matched oscillator fine tune input for adjusting the second clock signal responsive to a serial data stream applied as in input to the second phase-lock loop circuit, whereby the second clock signal forms a recovered clock signal synchronized to the serial data stream.

* * * * *